United States Patent [19]

Opresko

[11] 4,322,277
[45] Mar. 30, 1982

[54] STEP MASK FOR SUBSTRATE SPUTTERING

[75] Inventor: Stephen T. Opresko, Lancaster, Pa.

[73] Assignee: RCA Corporation, New York, N.Y.

[21] Appl. No.: 207,713

[22] Filed: Nov. 17, 1980

[51] Int. Cl.³ .............................................. C23C 15/00
[52] U.S. Cl. ................................ 204/192 R; 118/504;
118/505; 204/298
[58] Field of Search ............... 204/192 R, 192 C, 298;
118/504, 505

[56] References Cited

U.S. PATENT DOCUMENTS

| 3,514,391 | 5/1970 | Hablanian et al. | 204/298 |
| 3,766,041 | 10/1973 | Wasa et al. | 204/192 |
| 3,860,507 | 1/1975 | Vossen, Jr. | 204/192 |
| 3,897,325 | 7/1975 | Aoshima et al. | 204/298 |
| 3,999,283 | 12/1976 | Dean et al. | 29/572 |
| 4,010,312 | 3/1977 | Pinch et al. | 428/450 |
| 4,071,426 | 1/1978 | Pinch et al. | 204/192 F |

Primary Examiner—Aaron Weisstuch
Attorney, Agent, or Firm—Eugene M. Whitacre; Dennis H. Irlbeck; Lester L. Hallacher

[57] ABSTRACT

A mask for protecting the edges of substrates being sputtered from the sputtering material includes grooves which loosely receive the substrates. The width of the grooves exceeds the width of the substrates by a first dimension and the depth of the grooves above the substrate exceeds the thickness of the substrates by a second dimension. The ratio of the first to the second dimension is at least 5.

6 Claims, 5 Drawing Figures

U.S. Patent  Mar. 30, 1982  Sheet 1 of 2  4,322,277
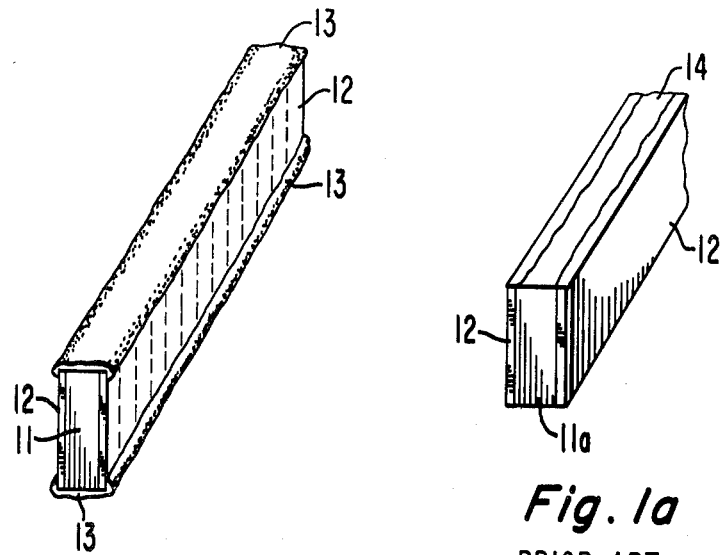
Fig. 1
PRIOR ART
Fig. 1a
PRIOR ART
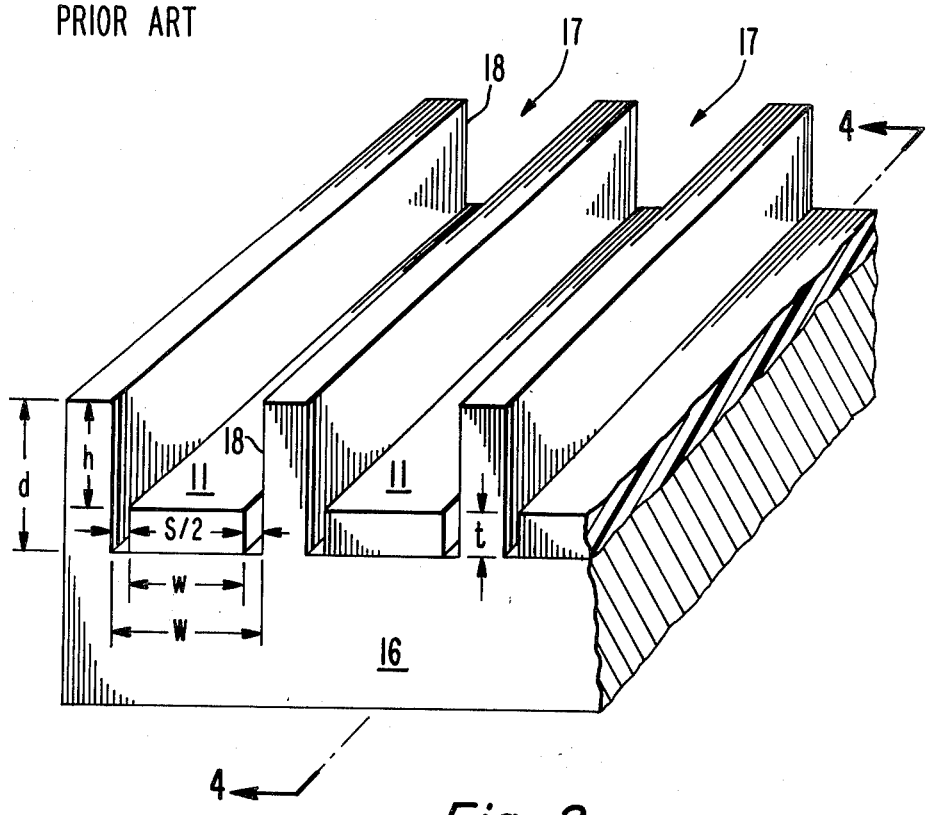
Fig. 2

STEP MASK FOR SUBSTRATE SPUTTERING

BACKGROUND OF THE INVENTION

This invention relates generally to sputtering substrates and particularly to a mask for shielding the edges of a substrate during sputtering.

The manufacture and use of cermet resistors for microelectronics and integrated circuits are well known in the art as evidenced by U.S. Pat. Nos. 4,010,312 and 4,071,426. Sputtering techniques also are known in the art as evidenced by U.S. Pat. No. 3,860,507.

In one method of making cermet resistors an insulating substrate, such as ceramic, is sputter coated on both sides with a conductive material, such as tungsten. The coated substrate is then cut into strips, commonly called logs in the art, and the edges are ground smooth to remove chips and burrs formed by the cutting process. A resistive material is applied across the edges of the logs and annealed to form a resistance of known value. The logs are then cut transversely across the width to form the individual resistances. The ends of the resistors thus made are the resistive portion and the sputtered material serves as the conductive portion through which electrical connection to the resistive portion can be made. This technique of making microelectronic resistors is disadvantageous because of the cumbersome and expensive grinding and cleaning procedures required after the sputtered substrates are sliced into the logs. Efforts have been made to decrease the complexity of the manufacturing procedure by cutting the substrate into logs prior to the sputtering process. The logs are then individually sputtered on both sides and the resistive material is applied across the edges, in substantially the same manner as before. This technique is disadvantageous because the sputtered material has a tendency to nonuniformily overlap onto the edges of the logs. The nonconductive spacing between the conductive sides then varies and as a result when the resistive material is applied to the edges the high resistance paths vary randomly and the values of the resistors formed from each log vary randomly.

The instant invention overcomes these disadvantages by the provision of a unique sputtering mask which shields the edges of the substrate from the sputtered material, permitting the manufacture of uniform microelectronic resistors while simultaneously eliminating cumbersome and expensive grinding and cleaning procedures.

SUMMARY OF THE INVENTION

A sputtering mask for shielding the edges of a substrate while the sides of the substrate are sputtered includes at least one groove for loosely receiving the substrate. The groove is slightly wider than the substrate and the depth of the groove substantially exceeds the thickness of the substrate so that the edges of the substrate are shielded from the sputtered material by the sides of the groove.

BRIEF DESCRIPTION OF THE DRAWINGS

FIG. 1 is a perspective view of a refractory substrate after a conductive material and a cermet resistive material are applied to the sides and edges respectively.

FIG. 1a is a perspective view of a refractory substrate with a conductive material sputtered onto the sides using the prior art sputtering techniques and without protecting the edges.

FIG. 2 is a perspective view of a preferred embodiment of a mask for shielding the edges of a substrate from the sputtering material.

DETAILED DESCRIPTION OF THE PREFERRED EMBODIMENT

Figure 3:
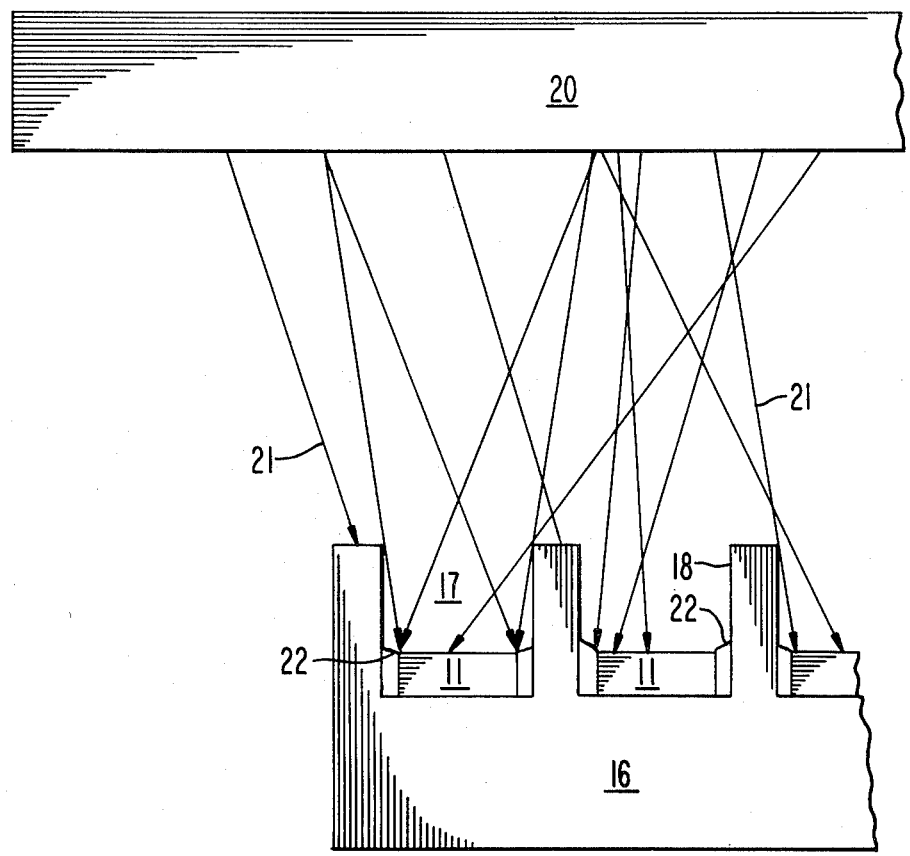
FIG. 3 is an end view showing shows how the preferred embodiment shields the edges of a substrate being sputtered from the sputtering material.

In FIG. 1 a refractory substrate 11, such as porcelain, has both sides coated with a sputtered conductive material 12, such as tungsten. At least one and sometimes both edges of the substrate 11 are coated with a high resistive cermet material 13. As explained in the patents referenced hereinabove, the cermet material 13 is annealed to a desired resistance value. A plurality of resistors is obtained from a single substrate by slicing the substrate transversely as indicated by the dotted lines.

The resistance material is applied to the edges of the substrate and therefore the uniformity of the resistors is dependent upon the ability to maintain uniform spacing between the conductive coatings 12. The substrate 11 is uniform in thickness and accordingly the resistors will also be uniform when the edges of the substrate 11 are kept free of the sputtered material.

FIG. 1a shows a prior art substrate 11a when the sputtered conductive coatings 12 have overlappd onto the edges 14 of the substrate so that the distance between the conductive coatings varies along the edge 14. Accordingly, because the resistive value of the resistors is dependent upon the nonconducting spacing across the edge 14 which lies between the conductive coatings, the variation in such spacing results in a variation in the resistance values of the resistors when the substrate is sliced into separate resistor elements.

FIG. 2 is a preferred embodiment of a mask 16 for preventing the sputtered material from contacting the edges of the substrate 11. The conductive mask 16 has a plurality of parallel grooves 17 so that each of the grooves 17 has two protective sides 18. The entire mask 16 including the grooves 17 is coated with a conductive material which preferably is the same material as that which will be sputtered onto the substrates 11. This coating prevents the substrates 11 from being contaminated with the material from which the mask 16 is made.

The substrates 11 are placed into the grooves 17 so that one side of each substrate faces the opening of a groove 17 and the other sides lies against the bottom of a groove. The width W of the grooves 17 exceeds the width w of the substrate 11 sides by a dimension equal to S. In FIG. 2 the substrates 11 are centered in the grooves 17 and the spacings between the edges of the substrates 11 and the protective sides 18 of the grooves therefore are S/2. The depth d of the grooves exceeds the thickness t of the substrates by the dimension h and the depth d is selected so that the dimension h exceeds the dimension S by a factor of at least 5 i.e. $h/S \geq 5$. Preferably the length of the grooves 17 slightly exceeds the length of the substrates 11.

FIG. 3 shows how the mask 16 protects the edges of the substrates 11 from the sputtering material. The mask 16, the end of which is shown in FIG. 3, in the preferred embodiment is a square having, for example, four inch (10.1 cm) sides with the grooves 17 parallel to one side. The mask 16 is arranged beneath a target 20 of the sputtering material, which in a preferred embodiment has a 7½inch (19 cm) diameter. A sputtering apparatus of the type described in U.S. Pat. 3,860,507 can be used for the sputtering process. During sputtering ions are ejected from the target material 20 and travel random paths 21 which are essentially line-of-sight paths. Thus, the ions approach the top sides of the substrate 11 from random angles and coat the top sides of the substrates 11 with the sputtered material. The protective sides 18 shield the edges of the substrates 11 for two reasons. First, the sides 18 act as restrictions in the paths 21 and prohibit the sputtered material from directly contacting the edges of the substrates. Secondly, as the ions adhere to the sides of the substrates 11 a self bias builds up on the corners of the substrates 11, resulting in electric fields 22 which extend from the substrate corners to the protective sides 18. These electric fields aid in preventing the charged ions from entering into the spaces S between the edges of the substrates 11 and the protective sides 18. The ratio of the dimension h to the dimension S is important because as this ratio increases the angle at which the ion paths 21 can strike the sides of the substrate 11 approaches 90°, thereby increasing the ion path restriction of the protective sides 18.

In FIGS. 2 and 3 the substrates 11 appear to be centered in the grooves 17. This is not important as the substrates can be located anywhere within the grooves and the sidewalls 18 will protect the substrate edges from the sputtered material. The only requirement is that the spaces between both the substrate edges and the protective sidewalls 18 be such that the ratio of the dimension h to the dimension S is equal to or greater than 5. Accordingly the substrates 11 can be placed into the grooves 17 without concern for the exact locations within the grooves and whether or not the substrates are parallel to the grooves. Additionally, because of the difference in the widths of the substrates and the grooves the insertion of the substrates into the grooves is rapid and easy so that automatic insertion means can be used.

Figure 4:
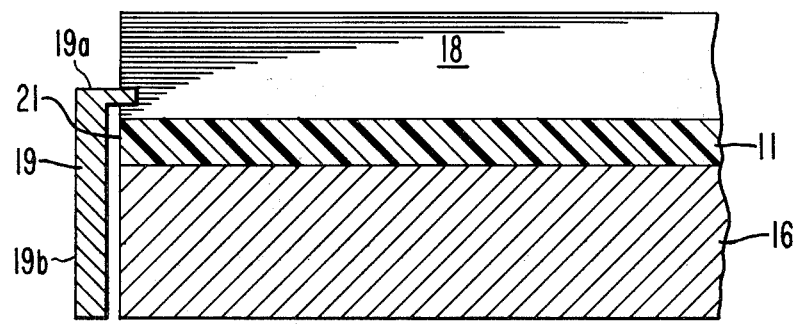
FIG. 4 is a cross-sectional view taken along line 4—4 of FIG. 2 showing how the ends of a substrate are shielded from the sputtering material by the addition of an L-shaped member.

FIG. 4 is a cross section view taken along line 4—4 of FIG. 2 with an L-shaped shield added. The L-shaped shield 19 protects the end 21 of the substrate 11 from the sputtered material. A leg 19a of the L-shaped shield 19 is arranged substantially parallel to and is spaced from the end 21 of the substrate 11. Preferably the spacing between the end 21 and the leg 19a of the shield 19 is substantially equal to the dimension S. The foot 19b of the L-shaped shield 19 is spaced above and is substantially parallel to the side of the substrate to be sputter coated. The L-shaped shield 19 therefore protects the end 21 from the sputtered material because only ions which are traveling at an angle can impact with the portion of the substrate 11 which lies directly beneath the foot of the L-shaped shield. The charge buildup on the corner of the substrate and the resulting field between the corner and the leg 19a of the shield 19 prevent the sputtered material from contacting the end 21 in the same manner that the sidewalls 18 protect the longitudinal edges of the substrate 11 from the sputtered material. Although only one substrate end 21 and one L-shaped shield 19 are shown in FIG. 4, a similiar shield is used on the other end of the substrate.

What is claimed is:

1. In the combination of a substrate and a mask for shielding the edges of said substrate while the sides of said substrate are sputter coated, an improvement comprising:
    at least one groove arranged in said mask for loosely receiving said substrate, the width of said groove exceeding the width of said substrate by the dimension S, and the depth of said groove exceeding the thickness of said substrate by the dimension h, and the ratio of h over S being at least five.

2. The improvement of claim 1 further including means for shielding the ends of said substrate.

3. The improvement of claim 2 wherein said means for shielding said ends include a substantially L-shaped shield arranged with the leg of the L substantially parallel to said end and the foot of the L substantially parallel to the side of said substrate.

4. The improvement of claim 3 wherein the spacing between said L-shaped shield and said end is substantially equal to S.

5. A method of sputter coating the sides of a substrate while simultaneously shielding the edges of the substrate from the sputter coating material including the steps of:
    providing a mask having at least one groove with a width exceeding the substrate width by the dimension S and a height exceeding the substrate thickness by the dimension h, and having the ratio of h over S to be at least five;
    placing a substrate into each of said at least one groove with one side of the substrate facing the opening of said groove;
    sputter coating said side with a desired material; and
    turning over said substrate and sputter coating the other side.

6. The method of claim 5 further including the step of protecting the ends of said substrate by placing substantially L-shaped shields along said ends; and positioning said L-shaped shields such that the legs of the L-shaped shields extend substantially parallel to the ends being protected and the feet of the L-shaped shields extend substantially parallel to the side of said substrate.

* * * * *